US006897372B2

(12) United States Patent
Jimenez

(10) Patent No.: US 6,897,372 B2
(45) Date of Patent: May 24, 2005

(54) METHODS AND APPARATUS FOR FORMING A FLEXIBLE JUNCTION

(75) Inventor: Jorge A. Jimenez, Downers Grove, IL (US)

(73) Assignee: Tellabs Operations, Inc., Naperville, IL (US)

( * ) Notice: Subject to any disclaimer, the term of this patent is extended or adjusted under 35 U.S.C. 154(b) by 97 days.

(21) Appl. No.: 10/229,946

(22) Filed: Aug. 28, 2002

(65) Prior Publication Data

US 2003/0047337 A1 Mar. 13, 2003

Related U.S. Application Data

(60) Provisional application No. 60/316,687, filed on Aug. 30, 2001.

(51) Int. Cl.[7] ................................................. H05K 9/00
(52) U.S. Cl. ................................ 174/35 R; 174/35 GC; 439/939
(58) Field of Search .......................... 174/35 R, 35 GC, 174/35 C, 35 MS; 361/816, 818; 439/607, 608, 939, 927

(56) References Cited

U.S. PATENT DOCUMENTS

| | | | | |
|---|---|---|---|---|
| 3,350,497 A | * | 10/1967 | Weaver, Jr. et al. | ... 174/35 MS |
| 3,553,343 A | * | 1/1971 | Garlington | ............. 174/35 MS |
| 3,562,402 A | * | 2/1971 | Dwyer | .................. 174/35 GC |
| 6,380,482 B1 | * | 4/2002 | Norte et al. | ............... 174/35 R |
| 6,471,256 B1 | * | 10/2002 | Fischer | ....................... 285/424 |

FOREIGN PATENT DOCUMENTS

GB 2050546 A * 1/1981 ........... F16L/51/00

* cited by examiner

*Primary Examiner*—Dean A. Reichard
*Assistant Examiner*—Carmelo Oliva

(57) ABSTRACT

A deformable connector incorporates first and second springs deflectable along multiple axis to compensate for misalignment. A connecting member is attached to the springs and includes perforations also to compensate for mis-alignment along an axis. EMI integrity is maintained with a deformable gasket that abuts the connecting member.

20 Claims, 9 Drawing Sheets

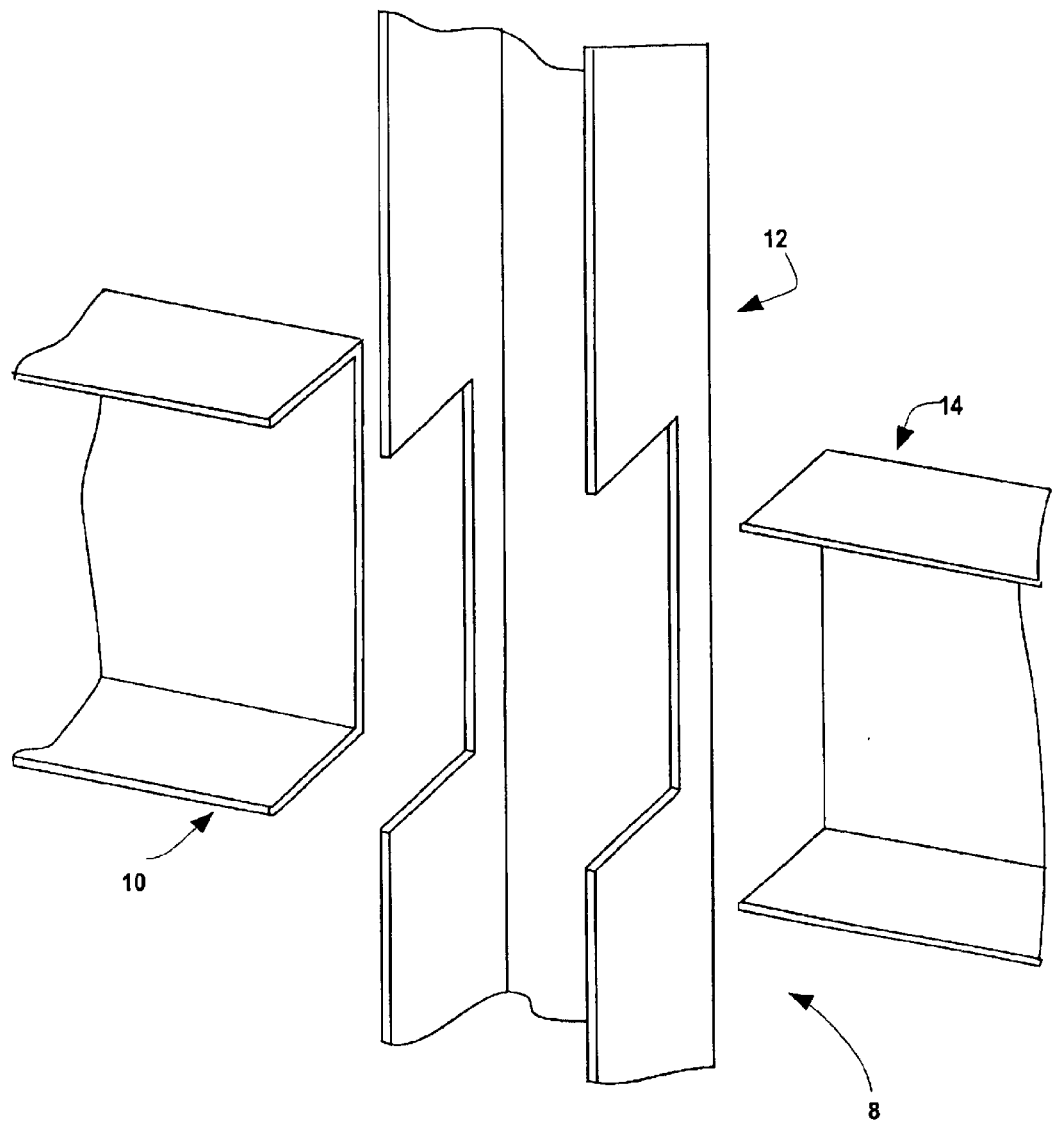

FIG. 3F
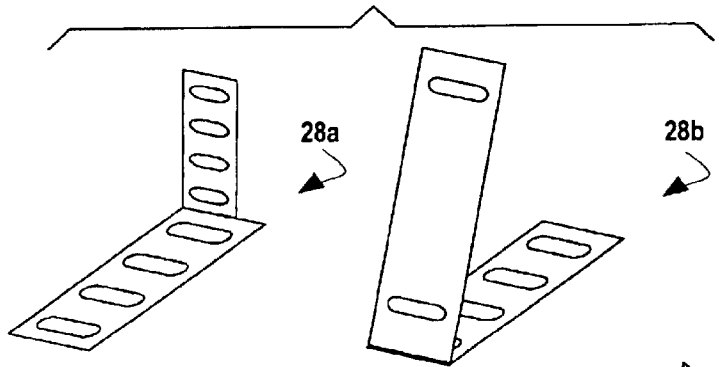
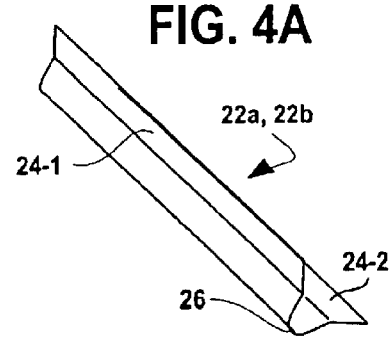
FIG. 4A
FIG. 4B
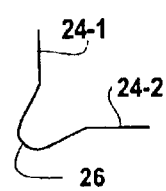
FIG. 4C
FIG. 4D
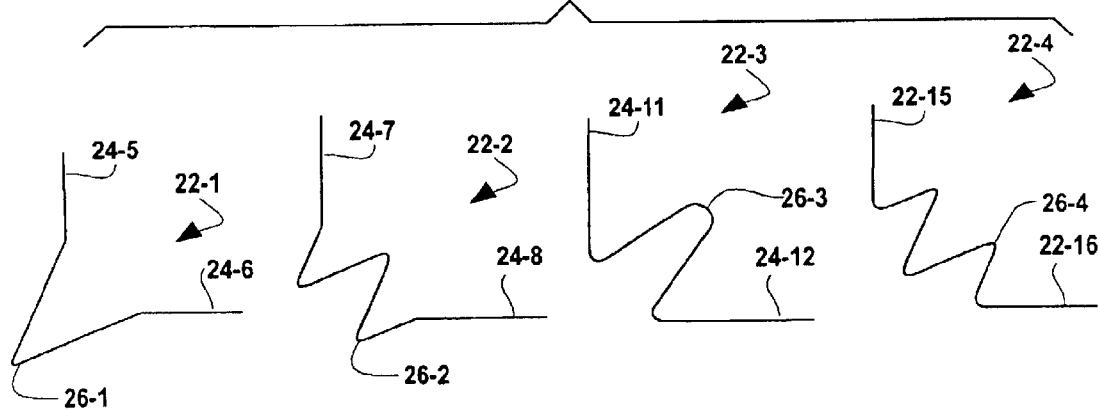

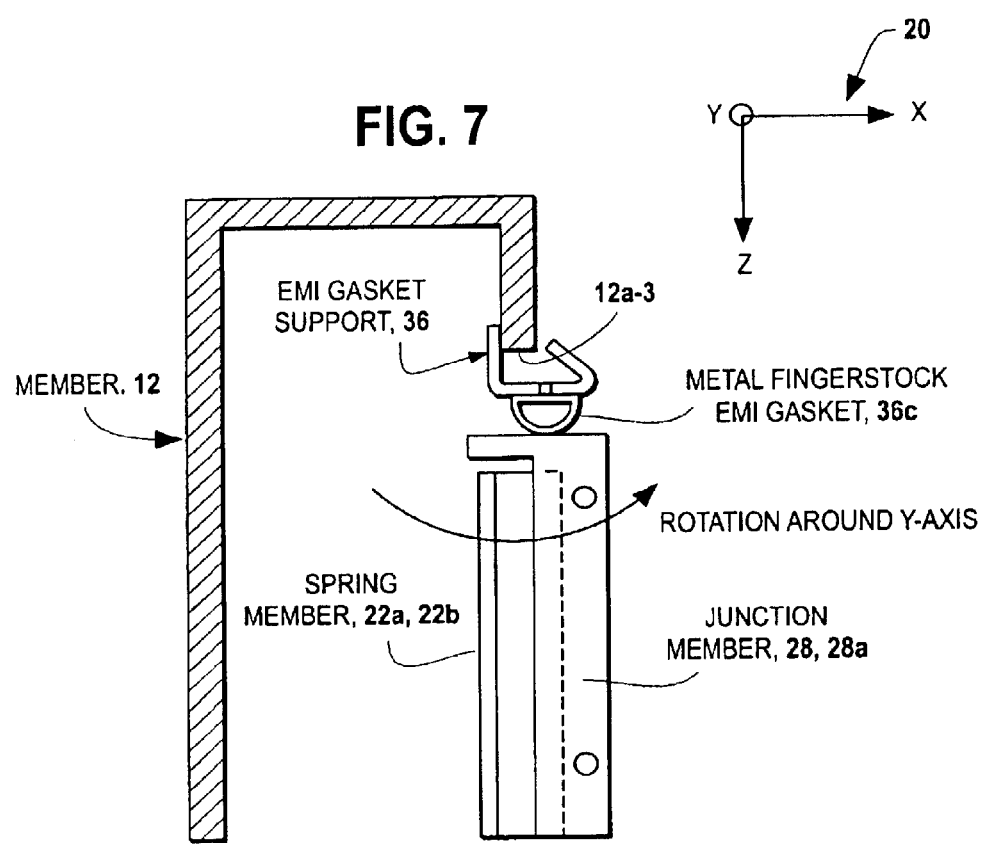

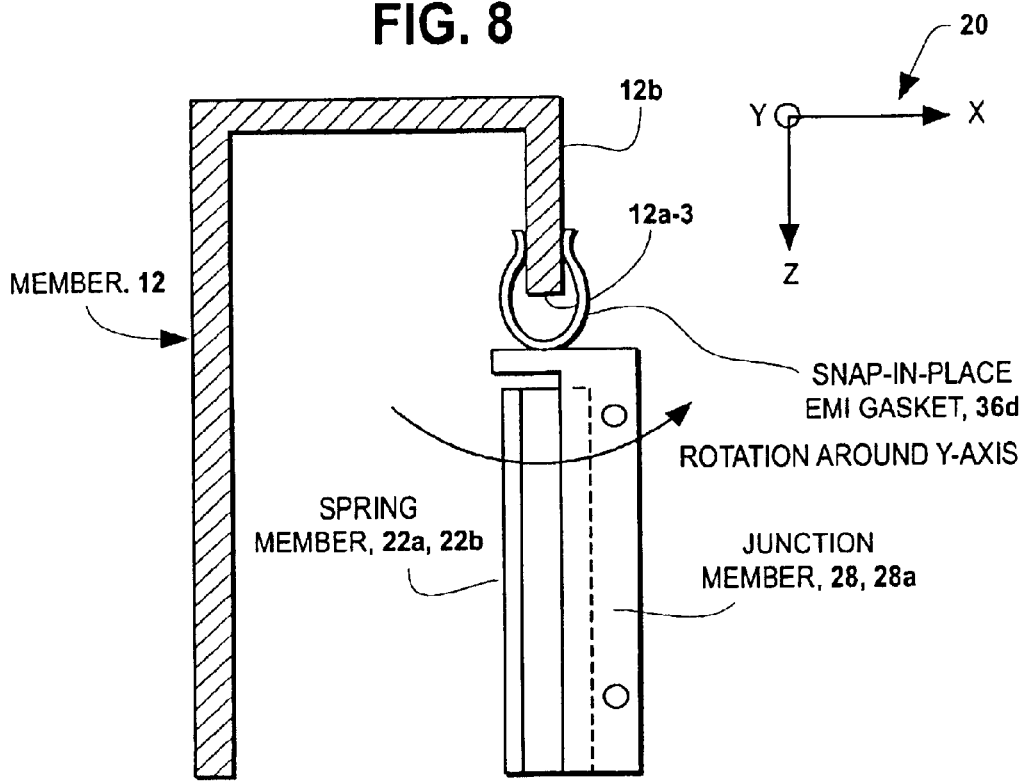
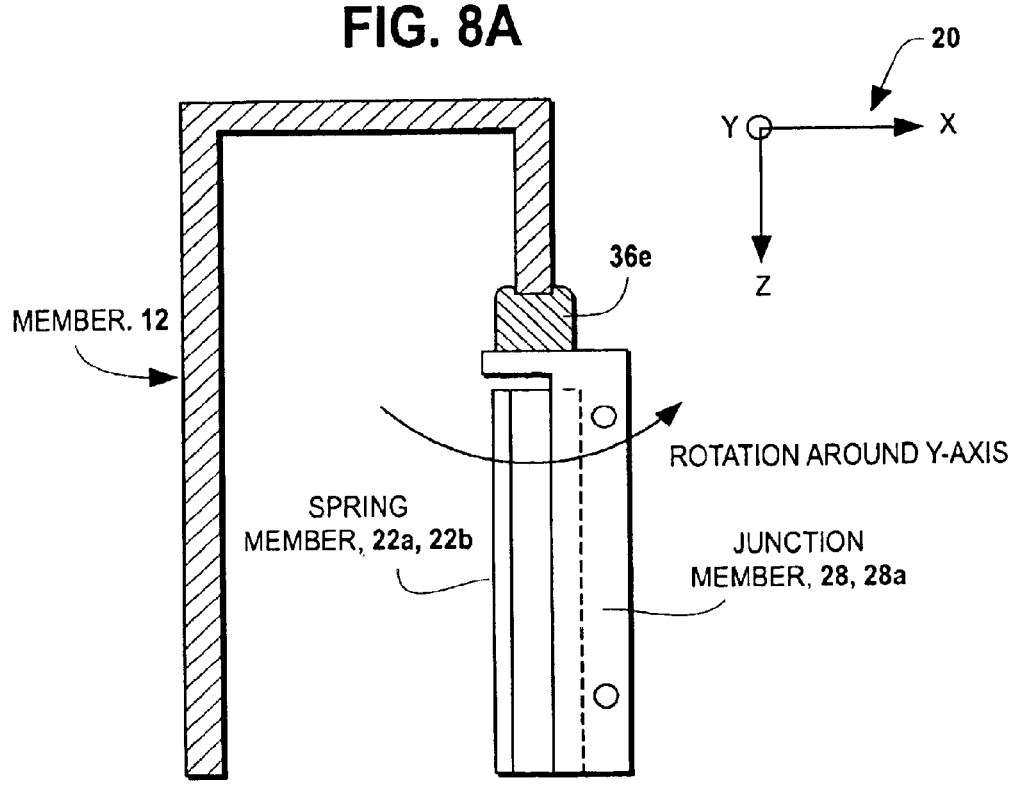

US 6,897,372 B2

METHODS AND APPARATUS FOR FORMING A FLEXIBLE JUNCTION

The benefit of an Aug. 30, 2001 filing date for Provisional Patent Application Ser. No. 60/316,687 is hereby claimed.

FIELD OF THE INVENTION

The present invention relates to mechanical junctions. More specifically, the present invention relates to an improved junction configuration that connects fixed members.

BACKGROUND OF THE INVENTION

Mechanical junctions of various configurations, such as T-junctions, bends, lateral junctions, etc. may be used for example, for routing wires or cables. Fixed members, such as two ducts or conduits, or a duct and an enclosure, may be connected by a fixed junction member. One problem with a fixed member-fixed junction member-fixed member configuration, for example, is that the fixed members may be mounted separately, causing misalignment of one or both of the members in various directions.

Another problem is containment or exclusion of electro magnetic radiation. Any wires, cables or electronic circuitry running inside any of the members may generate electromagnetic radiation that should be contained. Additionally, any wires, cables, or electronic circuitry running inside any of the members should be protected from any electromagnetic radiation caused by sources external to the members.

Prior junction configurations may provide electromagnetic interference (EMI) control by adding members such as gaskets and fasteners to the junction configuration. However, the additional members increase manufacturing, installation, and maintenance time and costs.

Prior junction configurations may prevent misalignment by connecting the fixed junction member to fixed conduits or housings using screws and slotted holes. However, a screw and slotted hole connection may accommodate misalignment in only one direction. Moreover, a screw and slotted hole connection may create seams where electromagnetic radiation may leak.

There continues to be a need for junction configurations which accommodate misaligned conduits, or housings. It would be preferable if such junction configurations also blocked EMI emissions from internal sources and excluded such emissions from external sources.

BRIEF DESCRIPTION OF THE DRAWINGS

FIG. 1 illustrates an intersection of three conduits;

FIG. 3F illustrates alternate attachment members;

FIGS. 4A–4C illustrate various views an exemplary spring member usable with the embodiment of FIG. 1;

FIG. 4D illustrates end views of alternate spring members;

FIG. 7 is a top view of an exemplary embodiment of the present invention, illustrating an EMI gasket, made of metal fingerstock, sealingly engaging the coupling member and another member;

FIG. 8 is a top view of an exemplary embodiment of the present invention, illustrating a snap-in-place EMI gasket, eliminating the need for an EMI gasket support, and sealingly engaging the coupling member and another member; and FIG. 8A is a top plan view of an alternate exemplary embodiment illustrating a gasket coupled to an attachment member.

DETAILED DESCRIPTION OF THE PREFERRED EMBODIMENTS

Figure 1A:
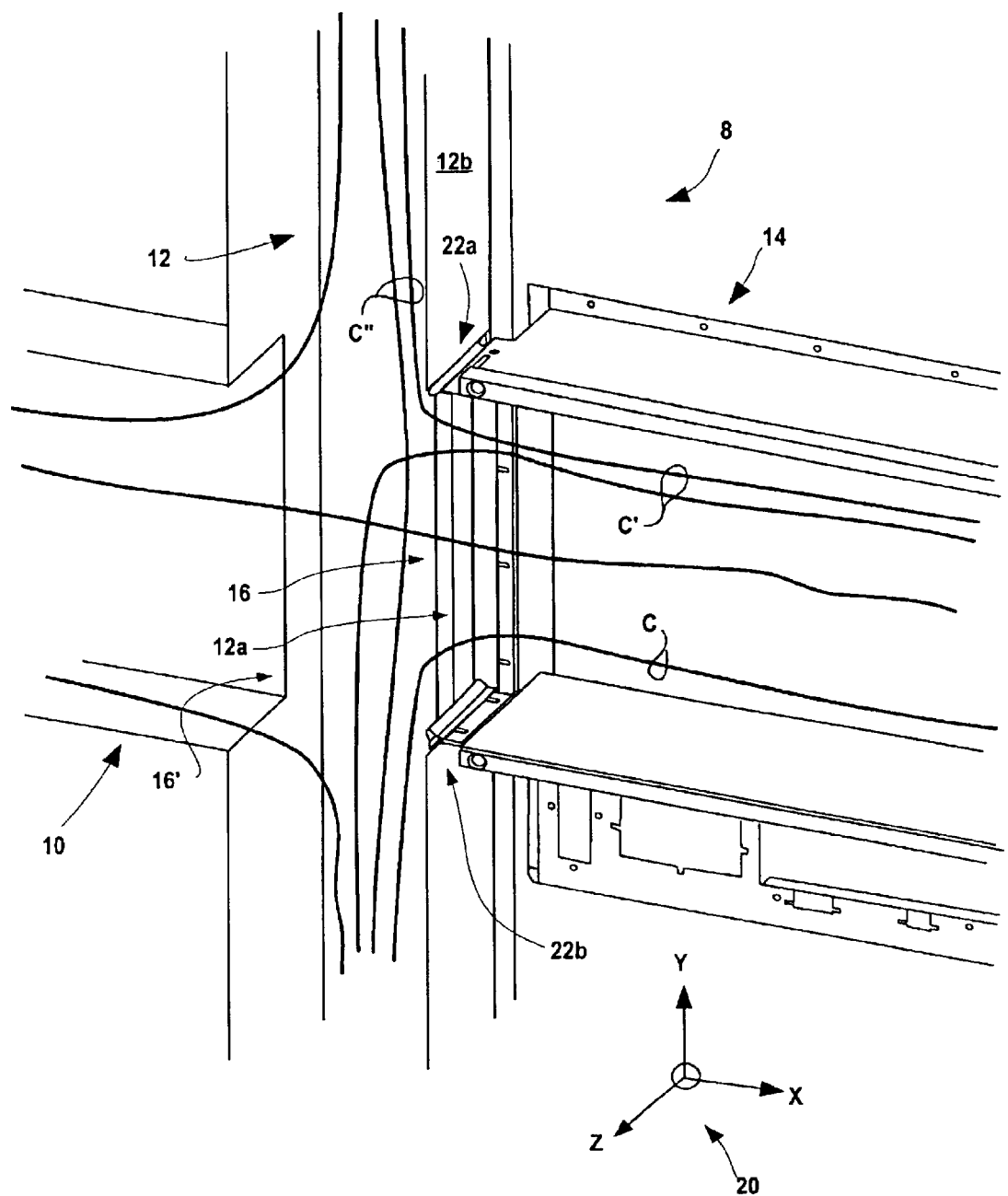
FIG. 1A illustrates an exemplary embodiment of the present invention.

While this invention is susceptible of embodiment in many different forms, there are shown in the drawing and will be described herein in detail specific embodiments thereof with the understanding that the present disclosure is to be considered as an exemplification of the principles of the invention and is not intended to limit the invention to the specific embodiments illustrated.

A flexible junction assembly is provided for joining first and second structures, for example conduits or ducts. Alternately, a duct and an enclosure or two enclosures can be coupled together.

FIG. 1 illustrates a multiple duct intersection 8. A horizontal duct 10 is to be joined to a vertical duct 12. A second horizontal duct 14 is also to be joined to the duct 12. One or more of the ducts 10, 12, 14 could be housings. A flexible junction which embodies the present invention can be used to couple the members 10, 12, 14 even in the presence of multi-axis misalignments.

Figure 2:
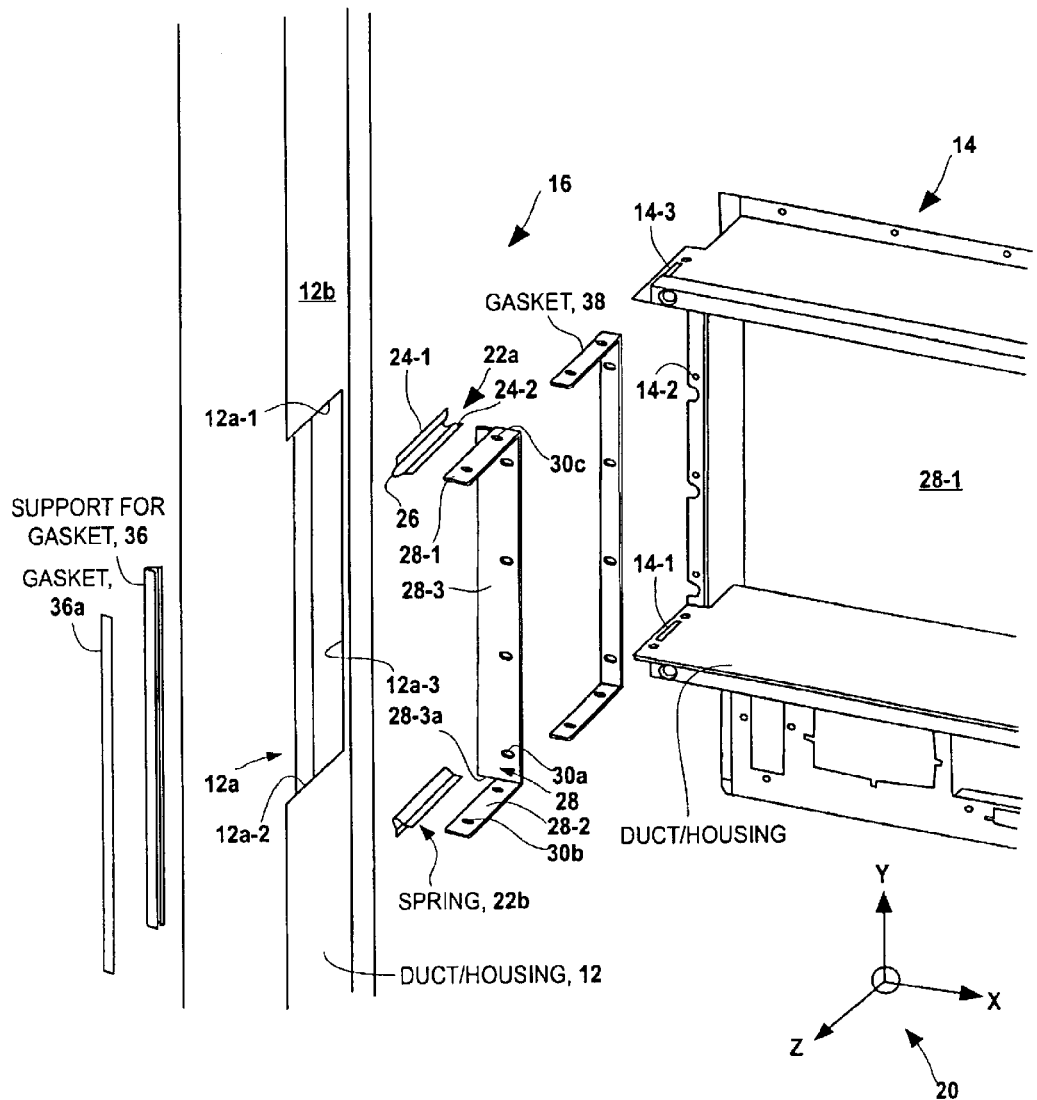
FIG. 2 illustrates a first exploded view of the embodiment of FIG. 1.

FIGS. 1A–2 illustrate various views of a junction which embodies the present invention. As described in more detail subsequently, the duct, conduit, or housing 12, is joined to the second duct, conduit or housing 14. Cables C, C', C" and C'" extend through and between the intersection of the members 10, 12, 14.

The conduits 12, 14 are joined by a junction, generally indicated at 16. The junction 16 compensates for misalignments between the ducts 12, 14 and also provides EMI shielding. A set of coordinates 20 is illustrated for reference purposes. A similar junction 16' can be used to join conduits 10, 12. A discussion of junction 16 will be sufficient to describe junction 16'.

Junction 16 includes first and second spaced apart spring members 22a, 22b. The members 22a, 22b are substantially identical. A description of spring member 22a will suffice for 22b as well.

The member 22a includes first and second spaced apart, elongated attachment sections 24-1 and 24-2. The attachment sections 24-1, -2 are joined by an arcuate, deformable spring portion 26, best shown in FIGS. 4A, 4C.

The spring portion 26 can be U-shaped, W-shaped, V-shaped or VV-shaped. Other variations come within the spirit and scope of the present invention.

Respective attachment sections, such as the section 24-1 of the springs 22a, b are connected by welding or fasteners, to slotted side wall 12b of housing or duct 12. The other attachment section, such as section 24-2 of each of the spring members 22a, b is connected, perhaps by fasteners or by welding, to a connecting member 28.

The spring member addresses misalignments between the conduits by being able to flex along three perpendicular axes: 1) the spring member can rotate relative to one axis; 2) the spring member can flex and translate relative to a second axis perpendicular to the first axis; 3) the spring member may permit translation along a third axis, perpendicular to the first and second axis due to flexure; and 4) the spring member may permit rotation about the third axis due to flexing and coiling.

The above-described type of junction or connector may be used to form other types of configurations or connections such as a bend or lateral junction. As described below, the connecting member 28 can exhibit a variety of configurations. It may be C-shaped, L-shaped, V-shaped or partially circular.

The slot 12a, as illustrated in FIGS. 1A and 2 has first and second parallel spaced apart sides 12a-1, -2 joined by an elongated edge 12a-3. The attachment section, corresponding to section 24-1 of each of the springs 22a, b is attached to side wall 12b adjacent to respective edges 12a-1, -2. Attachment can be effected by welding, soldering or the use of fasteners. When so-attached, each of the springs 22a, b extends in part from the side wall 12b toward the connecting member 28 to which the other attachment section, corresponding to section 24-2 of each of the springs 22a, b is attached.

Member 28 incorporates first and second elongated ends 28-1, -2. The ends 28-1, -2 are in turn joined by elongated member 28-3.

The ends 28-1, -2 are in turn fixedly attached to sections 24-2 of the springs 22a, b. For example, they can be welded to or attached together by fasteners. Similarly, it will be understood that the sections 24-1 of the springs 22a, b need not be welded to side wall 12b. Alternately, they could be attached with fasteners.

Each of the members 28-1, -2 and -3 incorporates slotted fastener receiving openings, such as representative slots or openings 30a, 30b and 30c. The slotted openings 30a, b, c correspond to fastener receiving openings, such as 14-1, 14-2, and 14-3 in duct or housing 14. The slotted openings 30a, b and c provide for axial additional motion along axis X by the duct or housing 14 relative to duct or housing 12.

A gasket 38 having a shape generally similar to the shape of the connecting member 28 can be located between the member 28 and the receiving end of the duct 14. When fasteners are used to connect the duct 14 to connecting member 28, the gasket 38 will be trapped therebetween. If the gasket 38 is formed of an EMI absorbent material, there will be no seams or gaps between the connecting member 28 and the end of the duct or housing 14 to permit the ingress or egress of EMI either into or from the ducts 12, 14.

The connecting member 28 is thus deflectably attached via springs 22a, b to the housing or duct 12 with the elongated member 28-3 extending past edge 12a-3 to the interior of duct 12.

A gasket support element 36 is carried on duct 12 on the edge 12a-3 of slot 12b. The support 36 in turn carries an elongated gasket 36a. The gasket 36a abuts side 28-3a, see FIG. 6, thereby providing a deflectable EMI excluding seam in the event that the member 28 is deflected or rotated about the Y-axis relative to duct or housing 12 due to the location of duct or housing 14.

Junction 16 compensates for misalignments between ducts 12, 14 on multiple axis. In addition to mechanical compensation, junction 16 maintains the integrity of the EMI shield formed, in part, by elements 12, 14.

The member 28 is coupled to the duct or housing 12 as follows: (1) at each of the top and bottom sides of the member 28, spring members 22a, b connect the C-shaped member 28 to the member 12 and (2), the EMI gasket 36a sealingly and slidably engages the side 28-3a of the member 28 with the duct or housing 12.

The shaped member 28 is attached to duct or housing 14 as follows: (1) at each of the top, bottom, and back sides of the member 28, fasteners connect the member 28 to the duct or housing 14 and (2) an EMI gasket 38 seals the seam where the top, bottom, and back sides of the member 28 meets the duct or housing 12.

The curved portions 26 of springs 22a, b provide smooth finished surfaces for cables C, C', C'', C''' which make ninety degree bends at the intersection of elements 10–14. This contributes to maintenance of the integrity of the respective cables.

Figure 3A:
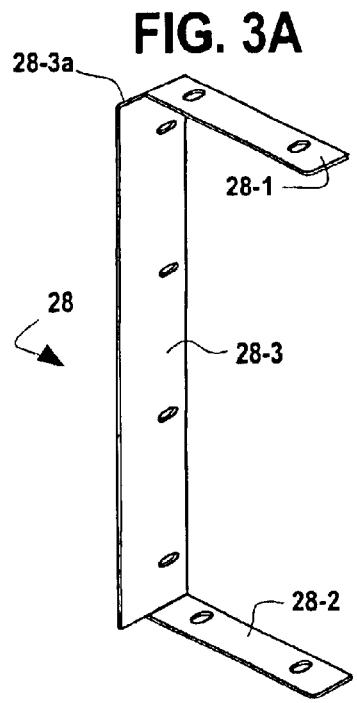
FIGS. 3A–3E illustrate various views of an exemplary C-shaped attachment member of the present invention.
Figure 3B:
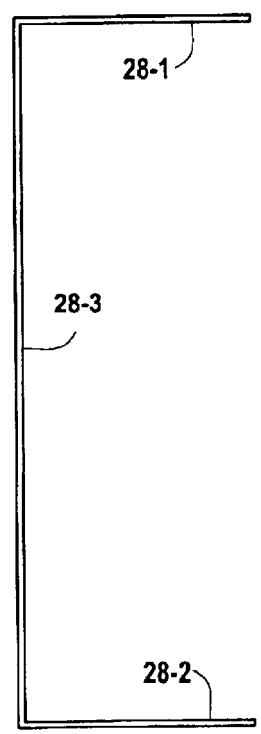
Figure 3C:
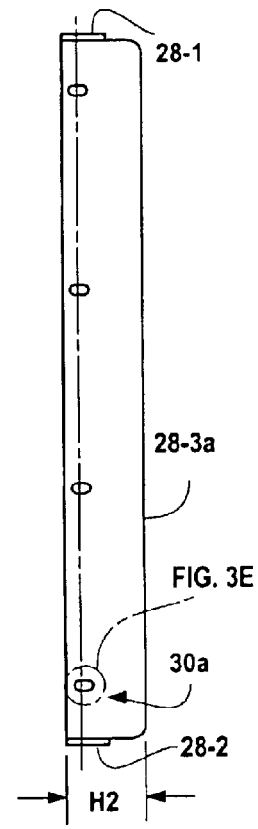
Figure 3D:
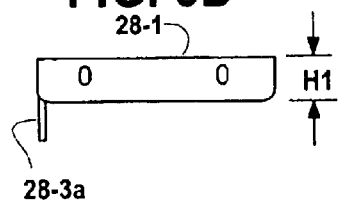
Figure 3E:
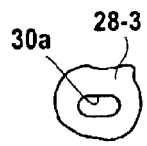

FIGS. 3A–E illustrate additional details of the connecting member 28. The ends 28-1, -2 have a first height parameter H1 while the interconnecting member 28-3 has a second, greater height parameter H2. Slotted openings 30a are illustrated in FIG. 3E.

It will be understood that while connecting member 28 is illustrated in FIGS. 1A and 2 as generally U- or C-shaped, it could also be L-shaped, element 28a, as illustrated in FIG. 3F. Alternately, the connecting member can be V-shaped, element 28b, as illustrated in FIG. 3F. Alternate shapes come within the spirit and scope of the present invention. All such shapes also preferably clamp a gasket, such as gasket 38, against a respective duct, such as duct 14. In an instance where rotation is present, the gasket compensates for misalignments between the respective connecting member and the adjacent duct.

FIGS. 4A, B, and C illustrate structural details of exemplary springs 22a, b. As illustrated in FIG. 4C, spring members 22a, b incorporate the smooth, deformable, arcuate region 26 which joins the attachment sections 24-1, -2. The arcuate region 26 is deformable along multiple axis to facilitate coupling together misaligned conduits or housings 12, 14.

The spring members 22a, b permit linear movement in the X, Y axis, and rotation relative to the Y axis. They also promote rigidity of the member 28 along the Z-axis, the axis of the spring, because the spring members may not flex along the Z-axis and the spring members are spot welded to the member 28 along the Z-axis.

Where the spring members 22a, b are spot welded to the members to which they connect, such as conduits or housings 12,14, they reduce the need for additional connecting members such as screws, slots, and EMI gaskets is reduced. This in turn reduces manufacturing, installation, and maintenance time and costs.

FIG. 4D illustrates alternates to the springs 22a, b. A spring 22-1 incorporates a V-shaped deformable region 26-1. The region 26-1 is bounded by attachment sections 24-5, -6.

A spring 22-2 incorporates a W-shaped deformable region 26-2. The region 26-2 is bounded by attachment sections 24-7, -8.

A spring 22-3 incorporates an inverted arcuate deformable region 26-3. The region 26-3 is bounded by two attachment sections 24-11, -12.

A spring 22-4 incorporates an inverted W-type deformable region 26-4. The region 26-4 is bounded by attachment sections 22-15, -16.

It will be understood that alternate spring configurations come within the spirit and scope of the invention. For example, one or both attachment sections or regions, such as regions 22-15, -16 could be arcuate and not planar to mate with a curved conduit or housing.

In the exemplary embodiment, the EMI gasket 36a that sealingly engages the surface 28-3a of the connection member 28 and the housing or conduit 12 can be made of fabric metal over foam material and can be semi-circular in cross-section. For EMI control purposes, various materials and cross-sectional shapes for the EMI gasket 36a may be used, as long as the EMI gasket sealing engages the surface 28-3a of the member 28 and the housing or duct 12. For example, representative materials include: metal fingerstock, or, mesh metal over an elastomer such as foam and conductive yarn over an elastomer.

When assembled, gasket 36a will be compressed by clamping member 28 to provide a continuous EMI shield. As rotation occurs on the Y axis, a substantially constant gap is maintained between side 28-3 and surface 12a-3. The gasket 36a fills that gap. Slight linear variations along the X axis do not break the EMI shield as surface 28-3a continuously engages the gasket 36a.

Other configurations come within the scope of the present invention. For example, a gasket can be retained on member 28-3 using slots formed therein or by use of adhesive.

Figure 5A:
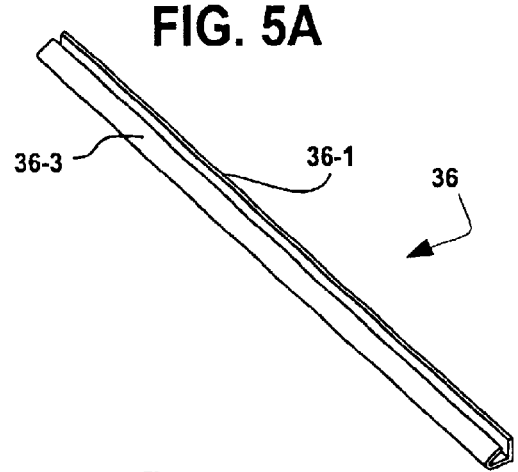
FIGS. 5A–5C illustrate various views of an exemplary embodiment EMI gasket support of FIG. 1.
Figure 5B:
Figure 5C:
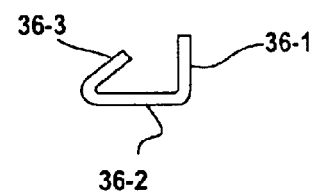

FIGS. 5A, B, C illustrate various views of elongated gasket support 36. Support 36 is attached to duct 12 in the slot 12a. It is formed with a triangular cross section, having sides 36-1, -2, -3. It can slidably engage sidewall 12b with a friction fit.

Figure 5D:
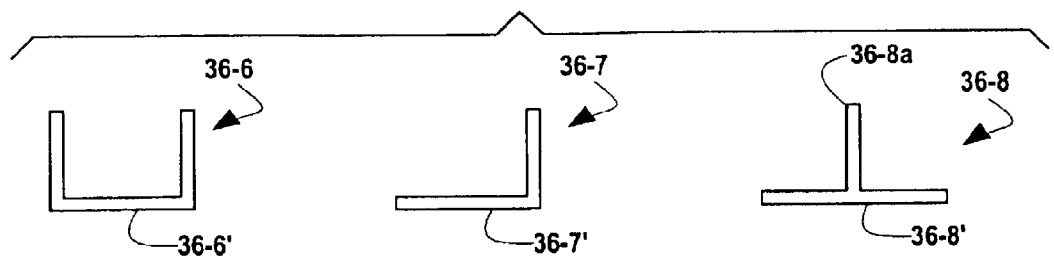
FIG. 5D illustrates alternate gasket supports.

FIG. 5D illustrates gasket supports having alternate configurations. Gasket support 36-6 has a U-shaped cross section and can be retained on edge 12a-3 by welding or with a friction fit. It carries a gasket on surface 36-6'.

Gasket support 36-7 has an L-shaped cross section and can be retained on edge 12a-3 with adhesive, welding or fasteners. It can also engage slots or member 12. It carries a gasket on surface 36-7'.

Gasket support 36-8 has a T-shaped cross section. It can be retained by welding a fastening stem 36-8a to housing or duct 12. A gasket is carried on surface 36-8'.

Figure 6:
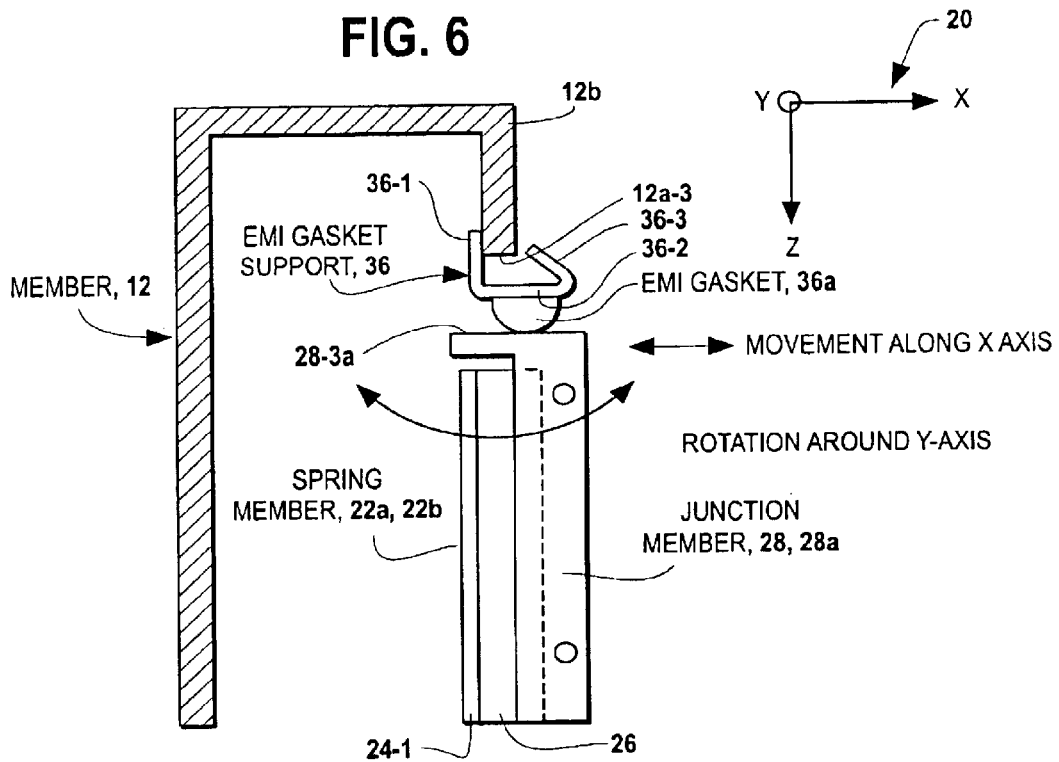
FIG. 6 is a top view of an exemplary embodiment of the present invention, illustrating an EMI gasket, with semicircular shaped cross-section, sealingly engaging the coupling member and another member.

FIG. 6 illustrates a top view of the EMI gasket 36a and illustrates its relationship to gasket support 36, the Y-axis and sidewall 12b of duct 12. As member 28 rotates about the Y-axis, the housing or support 36 and gasket 36a remaining contact with member 28-3a maintaining the EMI shield.

Figure 6A:
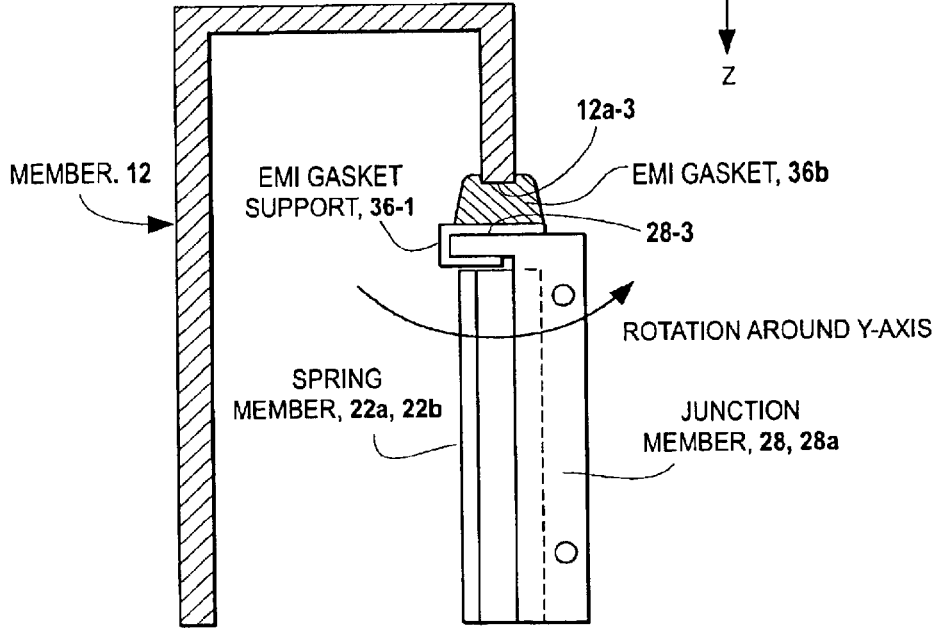
FIG. 6A is a top view of an alternate embodiment wherein the gasket is carried on the coupling member.

FIG. 6A illustrates an alternate gasket configuration. In FIG. 6A, gasket support 36-1 has a U-shaped cross section and slidably engages member 28-3a. An EMI gasket 36b, attached to support 36-1, extends toward and is in contact with edge 12a-3 thus providing the EMI shield. To minimize any chance of damage to the gasket 36b due to rubbing against the surface 12a-3, that surface could be widened, for example by bending a portion of conduit 12 in the vicinity of surface 12a-3 to create an "L" shaped region which the gasket 36b could abut. Alternately, caulk-like gasket material could be applied onto the edge 12a-3.

FIG. 7 illustrates a top view of an alternate embodiment using a metal fingerstock EMI gasket 36c. Also, other exemplary cross-sectional shapes for the EMI gasket include a circle or a rectangle. Alternate cross-sectional shapes may be used for the EMI gasket and support, as long as the EMI gasket support connects the EMI gasket to the vertical member and maintains an EMI seal between the EMI gasket and the vertical member.

In other embodiments of the present invention that require EMI control depending on the material and the cross-sectional shape of the EMI gasket, a support for the EMI gasket may not be needed. For example, form-in-place and snap-in-place EMI gaskets may eliminate the need for an EMI gasket support.

FIG. 8 illustrates a snap-in-place EMI gasket 36d that eliminates any need for an EMI gasket support. Gasket 36d can be formed with an inner flexible plastic body that can slidably engage side 12b at edge 12a-3. The body, on a surface facing the junction member 28 carries a compressible foam. A metal fabric covers the foam and body to provide a flexible, continuous EMI shield.

FIG. 8A illustrates a compressed EMI gasket 36e retained on surface 28-3a using slots or adhesive. Gasket 36e extends toward and is compressed by sidewall 12a-3 thereby providing the EMI seal.

Advantages are provided by having an EMI gasket that sealingly engages the side 28-3a of the member 28 and the member 12. A first advantage is that even upon rotation of the member 28 along the Y-axis, the EMI respective gasket maintains contact with both the surface 28-3a of the member 28 and the vertical member 12. It thus provides a constant EMI seal.

A second advantage of the EMI gaskets, such as 36a–e, is that it reduces the need for additional fasteners, and thus reduces manufacturing, installation, and maintenance time and costs.

Thus, a junction that embodies the invention includes at least a first spring member, which might be elongated, and which has first and second attachment sections adjoined by a deformable spring. A connecting member has at least first and second attachment parts. One of the attachment parts is configured for attachment to one of the two structures to be joined together. The other is attached to the spring member. The spring member is configured for attachment to the second of the two structures. This flexible junction configuration accommodates multi-axis misalignment between the structures.

As illustrated in FIGS. 1–2, duct 12 has a slot 12a in the vicinity of where junction 16 is to be installed so as to receive duct 14. This will permit electrical and/or optical cables C, C' to readily extend to/from duct 14 and to/from duct 12. One of the advantageous aspects of the junction 16 is that it maintains the integrity of the EMI shields formed by ducts 12 and 14 when the same are formed of EMI shielding materials such as metal or the like.

In the foregoing description, the invention is described with reference to specific example embodiments thereof. It will, however, be evident that various modifications and changes may be made thereto, without departing from the broader spirit and scope of the present invention. The specification and drawings are accordingly to be regarded in an illustrative rather than in a restrictive sense.

What is claimed is:

1. A flexible junction comprising:
    an elongated spring with first and second attachment sections oriented generally at ninety degrees to one another;
    a connector fixedly coupled to one of the attachment sections with the connector extending therefrom to a perforated region for interfacing to an external structure, where the spring/connector combination tolerates multi-axis, external mis-alignments while maintaining an electro-magnetic shield proximate to the combination where the connector has one of a U-shaped cross-section or an L-shaped cross section.

2. A junction as in claim 1 comprising:

a second elongated spring with third and fourth attachment sections oriented generally at ninety degrees to one another with the connector fixedly attached to one of the third or fourth attachment sections.

3. A junction as in claim 1 incorporating a gasket sealingly engageable with a portion of the connector.

4. A junction as in claim 1 where the connector has first and second sides joined at a predetermined angle with one side having a height parameter, in a direction extending generally along a seam of the joined sides, which has a greater value than a corresponding parameter for the other side.

5. A connector comprising:

a metal element with a region configured for releasably coupling to a first structure of a predetermined cross section;

at least one deformable metal spring attached to the metal element, displaced from the region, with the spring changing shape in response to force applied to the metal element, the spring having a region for attachment to another structure, the spring is deflectable along two different axis;

a gasket engageable with part of the metal element, at least when the element and spring are attached to respective structures, with the element, the spring and the gasket forming an electromagnetic shield with the combined element and spring configured to compensate for structural mis-alignments in three directions.

6. A flexible junction assembly for joining first and second structures, the assembly comprising:

a first element having first and second attachment sections joined by an elongated spring having at least one curved region;

a connecting member having at least first and second parts, at least one of the parts is configured for attachment to one structure and is connected to one of the attachment sections with the other attachment section configured for attachment to the other structure; and a deformable EMI blocking gasket that engages a portion of the connecting member.

7. An assembly as in claim 6 where the curved region extends parallel to a first axis, the attachment sections are rotatable relative to the first axis.

8. An assembly as in claim 7 where the gasket is coextensive with at least the portion of the connecting member.

9. An assembly as in claim 7 which includes a second spring, substantially identical to the first spring with the connecting member fixedly attached to respective attachment sections of both of the springs.

10. An assembly as in claim 9 where the first and second parts of the connecting member are spaced apart from and extend generally parallel to one another with an integrally formed intervening element therebetween.

11. An assembly as in claim 10, where the curved region of each spring forms a smooth exposed surface generally where the first and second structures are adjacent to the respective spring.

12. An assembly as in claim 11 where the spring deforms to compensate for multi-axis mis-alignments between the first and second structures while maintaining the smooth exposed surface.

13. An assembly as in claim 9 where the springs are each deformable along three different axes.

14. An assembly as in claim 7 with the first and second attachment sections oriented generally at ninety degrees to one another.

15. An assembly as in claim 14, where the curved region of each spring forms a smooth exposed surface generally where the first and second structures are adjacent to the respective spring.

16. An assembly as in claim 15 where the spring deforms to compensate for multi-axis mis-alignments between the first and second structures while maintaining the smooth exposed surface.

17. An assembly as in claim 6 where the spring is deformable along at least first and second substantially perpendicular axes.

18. An assembly as in claim 6 where the spring is deformable along at least a first axis.

19. An assembly as in claim 6 where the first and second parts of the connecting member are spaced apart and are joined by a third member.

20. An assembly as in claim 19 where the gasket is coextensive with the third member.

* * * * *